(12) United States Patent
Noh et al.

(10) Patent No.: US 7,704,666 B2
(45) Date of Patent: Apr. 27, 2010

(54) LASER INDUCED THERMAL IMAGING APPARATUS AND LASER INDUCED THERMAL IMAGING METHOD

(75) Inventors: Sok Won Noh, Seoul (KR); Tae Min Kang, Yongin (KR); Jin Soo Kim, Yongin (KR); Noh Min Kwak, Yongin (KR); Jae Ho Lee, Yongin (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 45 days.

(21) Appl. No.: 11/509,463

(22) Filed: Aug. 23, 2006

(65) Prior Publication Data

US 2007/0046770 A1 Mar. 1, 2007

(30) Foreign Application Priority Data

Aug. 30, 2005 (KR) ............ 10-2005-0080338

(51) Int. Cl.
*G03C 8/00* (2006.01)
*G03C 1/00* (2006.01)
(52) U.S. Cl. .................. 430/200; 430/199; 430/270.1
(58) Field of Classification Search ............ 430/199, 430/200, 270.1
See application file for complete search history.

(56) References Cited

U.S. PATENT DOCUMENTS

| | | | | |
|---|---|---|---|---|
| 3,927,943 | A | * | 12/1975 | Pohl et al. ............ 355/132 |
| 4,377,339 | A | | 3/1983 | Coppock |
| 4,975,637 | A | * | 12/1990 | Frankeny et al. ......... 324/760 |
| 5,725,979 | A | * | 3/1998 | Julich ................ 430/30 |
| 6,509,142 | B2 | * | 1/2003 | Baxter et al. ............ 430/396 |
| 6,649,286 | B2 | | 11/2003 | Kim et al. |
| 6,666,541 | B2 | | 12/2003 | Ellson et al. |

(Continued)

FOREIGN PATENT DOCUMENTS

CN 1591108 A 3/2005

(Continued)

OTHER PUBLICATIONS

Patent Abstracts of Japan for Publication No. 2003-076297; Date of Publication of Application Mar. 14, 2003 in the name of Kubota.

(Continued)

*Primary Examiner*—Matthew Luu
*Assistant Examiner*—Kendrick X Liu
(74) *Attorney, Agent, or Firm*—Christie, Parker & Hale, LLP

(57) ABSTRACT

A laser induced thermal imaging apparatus and a laser induced thermal imaging method. A laser induced thermal imaging apparatus has electromagnets in an adhesion frame and a substrate stage to closely adhere a donor film to a substrate. The laser induced thermal imaging apparatus includes a process chamber including a donor film and a substrate, and adapted to carry out a process for depositing the donor film on the substrate; a substrate stage having a first electromagnet, and positioned in the process chamber to support the substrate; an adhesion frame having a second electromagnet, and positioned over the substrate stage, wherein the donor film and the substrate are disposed between the substrate stage and the adhesion frame in the process chamber; and a laser oscillator adapted to apply a laser output to the donor film.

15 Claims, 6 Drawing Sheets

U.S. PATENT DOCUMENTS

| | | | |
|---|---|---|---|
| 6,939,649 | B2 | 9/2005 | Hotta et al. |
| 7,217,334 | B2* | 5/2007 | Toyoda .................. 156/230 |
| 7,233,101 | B2* | 6/2007 | Jin ........................ 313/309 |
| 7,502,043 | B2 | 3/2009 | Noh et al. |
| 2002/0030440 | A1 | 3/2002 | Yamazaki |
| 2003/0042849 | A1* | 3/2003 | Ogino .................... 313/504 |
| 2005/0007442 | A1* | 1/2005 | Kay et al. .............. 347/248 |
| 2005/0133802 | A1 | 6/2005 | Lee et al. |
| 2005/0153472 | A1* | 7/2005 | Yotsuya .................... 438/29 |
| 2005/0181587 | A1 | 8/2005 | Duan et al. |
| 2006/0063096 | A1 | 3/2006 | Lee et al. |
| 2007/0009671 | A1* | 1/2007 | Manz ..................... 427/468 |
| 2007/0103920 | A1* | 5/2007 | Noh et al. .............. 362/458 |

FOREIGN PATENT DOCUMENTS

| | | |
|---|---|---|
| EP | 0 790 138 A1 | 8/1997 |
| JP | 05-138959 | 6/1993 |
| JP | 08-123000 | 5/1996 |
| JP | 10-41069 | 2/1998 |
| JP | 11-054275 | 2/1999 |
| JP | 11-158605 | 6/1999 |
| JP | 2000-096211 | 4/2000 |
| JP | 2002-260921 | 9/2002 |
| JP | 2003-76297 | 3/2003 |
| JP | 2003-187973 | 7/2003 |
| JP | 2004-087143 | 3/2004 |
| JP | 2004-296224 | 10/2004 |
| JP | 2004-355949 | 12/2004 |
| JP | 2005-085799 | 3/2005 |
| TW | 369483 | 9/1999 |

OTHER PUBLICATIONS

Patent Abstracts of Japan, Publication No. 10-041069, dated Feb. 13, 1998, in the name of Shigeo Fujimori et al.

Patent Abstracts of Japan, Publication No. 2004-296224; dated Oct. 21, 2004, in the name of Hidefumi Odaka et al.

Patent Abstract of Japan, Publication No. 2004-355949; dated Dec. 16, 2004 in the name Akira Ebisawa et al.

SIPO Office action dated Nov. 7, 2008, for corresponding Chinese application 2006101369376, w/ English translation of text, indicating relevance of listed references in this IDS.

U.S. Office action dated Nov. 28, 2008, for related U.S. Appl. No. 11/512,991, indicating relevance of listed reference in this IDS.

U.S. Office action dated Sep. 19, 2008, for related U.S. Appl. No. 11/508,159 (now issued as U.S. Patent 7,502,043), noting listed reference in this IDS, namely, U.S. Patent 6,666,541.

Sep. 29, 2008 response to U.S. Office action dated Sep. 19, 2008 for related U.S. Appl. No. 11/508,159 (now issued as U.S. Patent 7,502,043.

Japanese Office action dated Mar. 24, 2009, for related Japanese application 2006-061367, noting Japanese references listed in this IDS.

Patent Abstracts of Japan, Publication No. 11-054275, dated Feb. 26, 1999, in the name of Ching W. Tang.

Patent Abstracts of Japan, Publication No. 11-158605, dated Jun. 15, 1999, in the name of Takeshi Yamazaki.

Patent Abstracts of Japan, Publication No. 2000-096211, dated Apr. 4, 2000, in the name of Yasuo Kingo et al.

Patent Abstracts of Japan, Publication No. 2002-260921, dated Sep. 13, 2002, in the name of Hi Jung Him et al.

Patent Abstracts of Japan, Publication No. 2003-187973, dated Jul. 4, 2003, in the name of Gyeong Bin Bae et al.

Patent Abstracts of Japan, Publication No. 2004-087143, dated Mar. 18, 2004, in the name of Junichi Muramoto.

Patent Abstracts of Japan, Publication No. 2005-085799, dated Mar. 31, 2005, in the name of Naoyuki Toyoda.

Japanese Office action dated May 12, 2009, for corresponding Japanese application 2006-080211, noting listed references in this IDS, as well as JP 11-158605 and JP 2005-085799, both filed in an IDS dated May 1, 2009.

\* cited by examiner

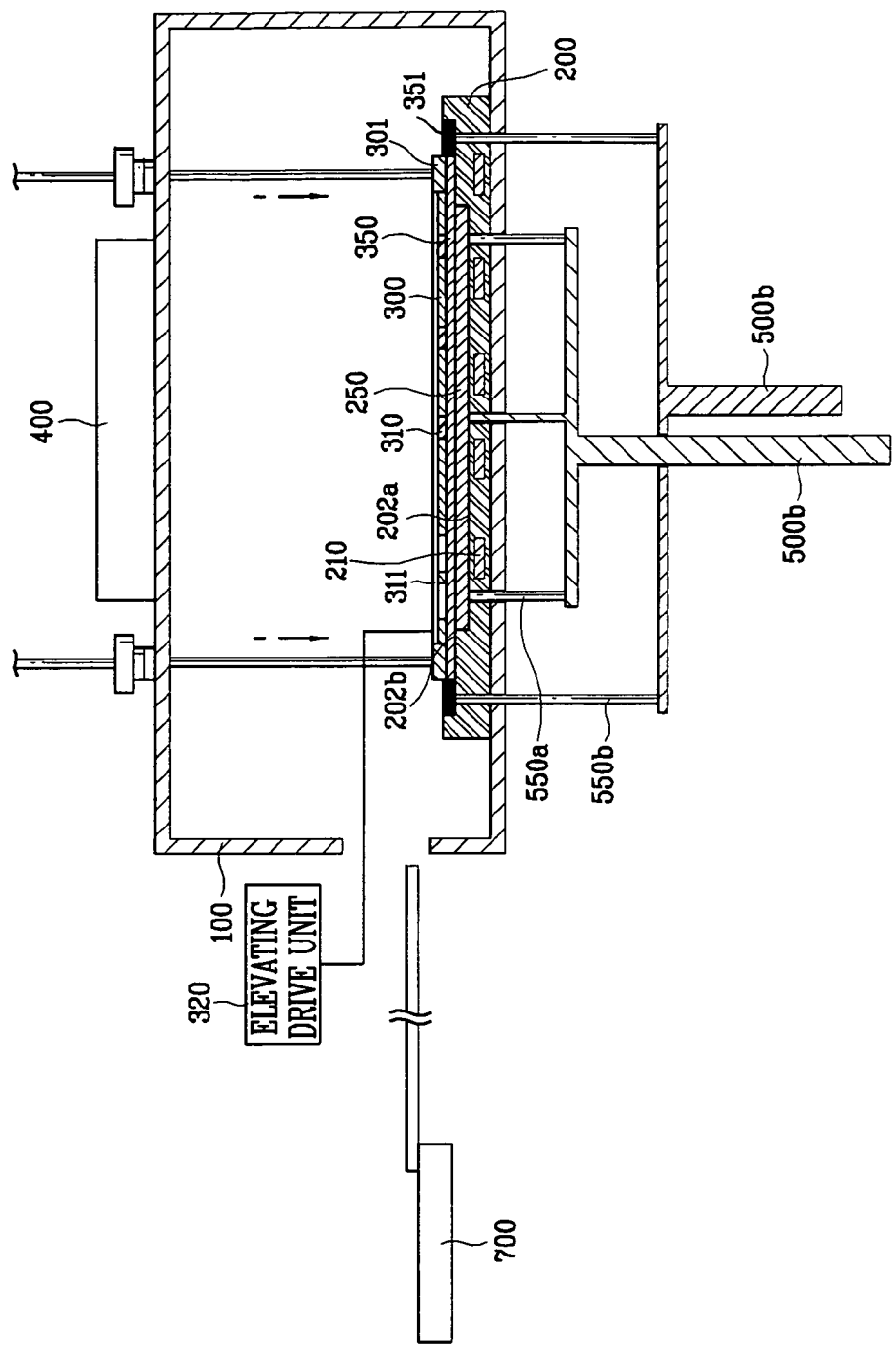

LASER INDUCED THERMAL IMAGING APPARATUS AND LASER INDUCED THERMAL IMAGING METHOD

CROSS-REFERENCE TO RELATED APPLICATIONS

This application claims priority to and the benefit of Korean Patent Application No. 10-2005-0080338 filed on Aug. 30, 2005, in the Korean Intellectual Property Office, the entire content of which is incorporated herein by reference.

BACKGROUND

1. Field of the Invention

The present invention relates to a laser induced thermal imaging (LITI) apparatus and a laser induced thermal imaging method, and more specifically to a laser induced thermal imaging apparatus and a laser induced thermal imaging method for closely adhering a donor film to a substrate using an adhesion frame including an electromagnet and a substrate stage having an electromagnet and performing a laser induced thermal imaging process.

2. Discussion of Related Art

Generally, in an organic light emitting diode, an anode electrode, which is a lower electrode, is formed on an insulating substrate, an organic thin-film layer is formed on the anode electrode, and a cathode electrode, which is an upper electrode, is formed on the organic thin-film layer. The organic thin-film layer includes at least one of a hole injecting layer, a hole transport layer, an emission layer, a hole suppression layer, an electron transport layer or an electron injecting layer.

A method for forming the organic thin-film layer includes a deposition method and a lithographic method. The deposition method, which is a method for forming an organic light-emitting layer by vacuum depositing organic luminescent materials using a shadow mask, has problems in that it is difficult to form a micro-pattern, and also to apply to a large-size display device due to deformation of the mask. The lithographic method, which is a method for forming an organic light-emitting layer by depositing organic luminescent materials, followed by patterning them using a photoresist, may form a pattern having a fine pitch, but has a problem in that the properties of the organic light-emitting layer are deteriorated by a developing solution for forming a photoresist pattern or an etching solution of the organic luminescent materials.

In order to solve the problems described above, there has been proposed a method for directly pattering an organic light-emitting layer. An ink jet method is used to form an organic light-emitting layer by dissolving or dispersing luminous materials and dispensing the resultant dispensing solution from a head of an ink-jet printer. The ink jet method is relatively simple in terms of the process, but has problems in that its output is low, thickness of the layer is not uniform, and it is difficult to apply to a large-size display device.

SUMMARY OF THE INVENTION

In an exemplary embodiment according to the present invention, a laser induced thermal imaging apparatus includes a chamber, a substrate stage, an adhesion frame and a laser oscillator. The chamber has a donor film and a substrate and is adapted to carry out a process for laminating the donor film on the substrate. The substrate stage has a first electromagnet, and is positioned in the chamber to support the substrate. The adhesion frame has a second electromagnet, and is positioned over the substrate stage. The donor film and the substrate are disposed between the substrate stage and the adhesion frame in the chamber. The laser oscillator is adapted to apply a laser output to the donor film.

In another exemplary embodiment according to the present invention, a laser induced thermal imaging method is provided. A donor film and a substrate positioned between a substrate stage and an adhesion frame are laminated. An electric current is supplied to the substrate stage and the adhesion frame to generate a magnetic force in the substrate stage and the adhesion frame due to the current. The donor film is adhered to the substrate using the magnetic force.

BRIEF DESCRIPTION OF THE DRAWINGS

These and/or other aspects and features of the invention will become apparent and be more readily appreciated from the following description of exemplary embodiments, taken in conjunction with the accompanying drawings of which:

FIGS. 2A to 2E are cross-sectional views showing a laser induced thermal imaging method according to an exemplary embodiment of the present invention.

* Description of major parts in the figure *

| | |
|---|---|
| 100: | Chamber |
| 200: | Substrate stage |
| 300: | Adhesion frame |
| 400: | Laser oscillator |
| 500a, 500b: | Elevating unit |

DETAILED DESCRIPTION

Hereinafter, certain exemplary embodiments according to the present invention will be described with reference to the accompanying drawings.

Figure 1:
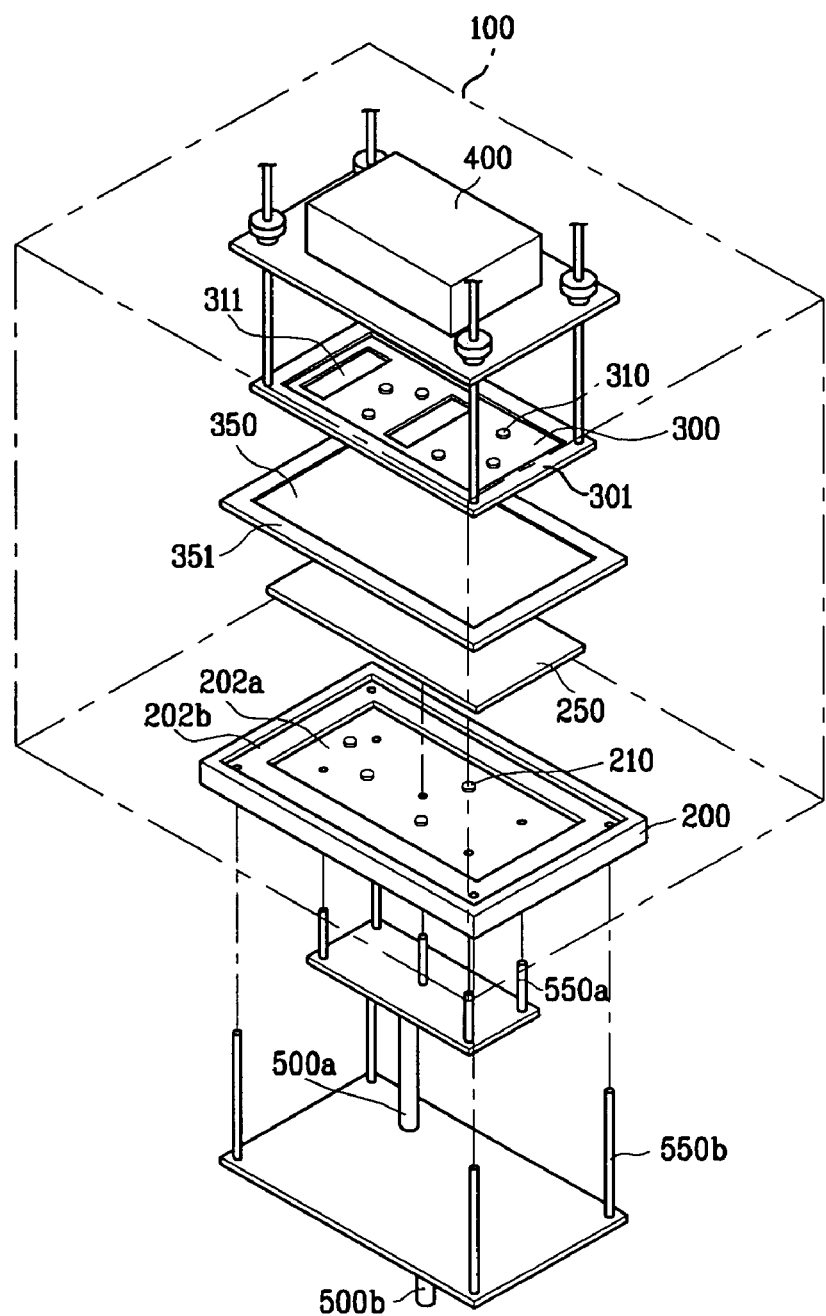
FIG. 1 is an exploded perspective view showing an example of a laser induced thermal imaging apparatus according to an exemplary embodiment of the present invention.

FIG. 1 is an exploded perspective view showing an example of a laser induced thermal imaging apparatus according to an exemplary embodiment of the present invention.

Referring to FIG. 1, the laser induced thermal imaging apparatus according to an exemplary embodiment of the present invention includes a chamber 100, a substrate stage 200, an adhesion frame 300, a laser oscillator 400 and elevating units 500a, 500b.

In the chamber 100, a process for laminating a donor film 350, which is a deposition source, is performed to transfer a predetermined organic material onto a substrate 250. Accordingly, as the apparatus for carrying out the process for laminating the substrate 250 and the donor film 350, at least the substrate stage 200 and the adhesion frame 300 are included within the chamber 100. During the lamination process, the chamber 100 is in a vacuum state.

The substrate stage 200 is composed of a first arrangement groove (or a depressed region) 202a and a second arrangement groove 202b for arranging the substrate 250 and the donor film 350, respectively. Generally, the second arrangement groove 202b is formed around the periphery of the first arrangement groove 202a along the shape of the donor film 350 since the donor film 350 has a larger area than that of the substrate 250. The first arrangement groove 202a and the second arrangement groove 202b are formed with a predetermined stepped difference, and the second arrangement groove 202b is formed with a higher predetermined height than that of the first arrangement groove 202a. Also, the substrate stage 200 includes at least one first electromagnet 210. The first electromagnet 210 may be disposed on a single plane, but a plurality of the first electromagnets 210 may also be formed into a concentric circle, or arranged in a plurality of horizontal and perpendicular rows.

The adhesion frame 300 has a second electromagnet 310, and it is positioned over the substrate stage 200. The donor film 350 and the substrate 250 are disposed between the substrate stage 200 and the adhesion frame 300 in the chamber 100. In addition, at least one opening 311 having a pattern corresponding to a portion of the donor film 350 to be transferred is formed in the adhesion frame 300. That is to say, the donor film 350 should be transferred onto the substrate 250 as much as a volume of the organic material to be transferred since the donor film 350 is used as a transfer source for transferring an organic material onto the substrate 250. Accordingly, a predetermined pattern of the opening 311 is formed in the adhesion frame 300 so as to transfer a desired area of the donor film 350 onto the substrate 250. In addition, the adhesion frame 300 itself may be formed into the second electromagnet 310, and may also be formed by adhering the second electromagnet 310 to the upper or lower portion of the adhesion frame 300. The adhesion frame 300 may be fixed by an adhesion frame tray 301 to be driven up and down.

The laser oscillator 400 may be located at the outside or inside of the chamber 100, and it may be positioned over the adhesion frame 300 to apply a laser output onto the adhesion frame 300 (and to the donor film 350 through the at least one opening 311).

The elevating units 500a, 500b may be divided into the first elevating unit 500a and the second elevating unit 500b. The first elevating unit 500a has at least one first pin 550a adapted to driving the substrate 250 up and down, and the second elevating unit 500b has at least one second pin 550b adapted to driving the donor film 350 up and down. As an example, at first, the first elevating unit 500a moves up to receive the substrate 250 from a translocation apparatus (Not shown), and then moves down to arrange it in the first arrangement groove 202a. Subsequently, the second elevating unit 500b moves up to receive the donor film 350 from the translocation apparatus (Not shown), and then moves down to arrange it in the second arrangement groove 202b. The substrate 250 and the donor film 350 are laminated using such an operation. Here, the donor film 350 is fixed by a film tray 351 such that it can move up.

The aforementioned laser induced thermal imaging apparatus according to an exemplary embodiment of the present invention further includes an elevating drive unit 320 (see FIGS. 2A-2E) coupled to the adhesion frame 300, such that the adhesion frame 300 can be driven up and down by the elevating drive unit. That is to say, since the adhesion frame 300 includes the second electromagnet 310, it becomes a magnet to generate a magnetic field if a predetermined electric current is applied to the adhesion frame 300. Accordingly, the elevating drive unit may include or be coupled to a current source for applying an electric current to the adhesion frame 300 so that adhesion strength and operation of the adhesion frame 300 can be controlled according to a magnitude and direction of the electric current.

FIGS. 2A to 2E are cross-sectional views showing a laser induced thermal imaging method according to an exemplary embodiment of the present invention.

Figure 2A:
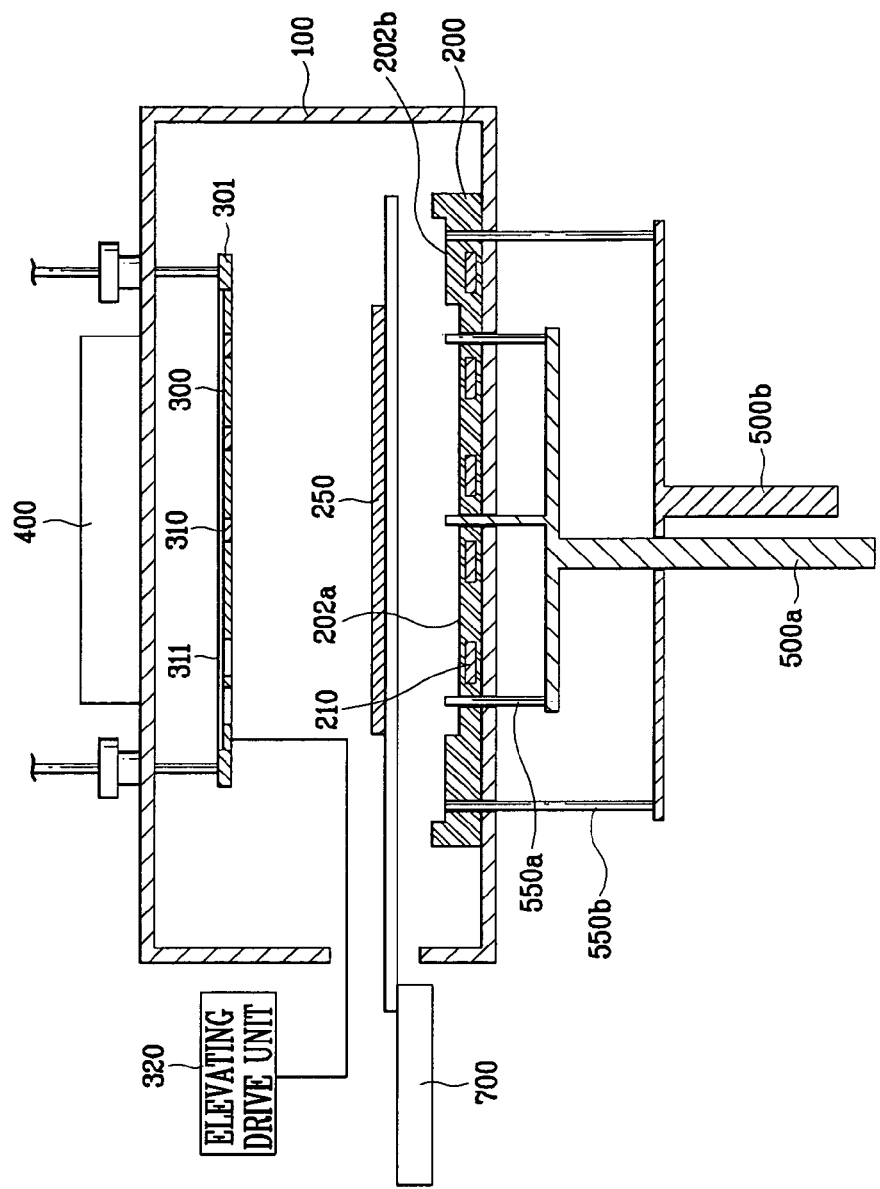
Figure 2B:
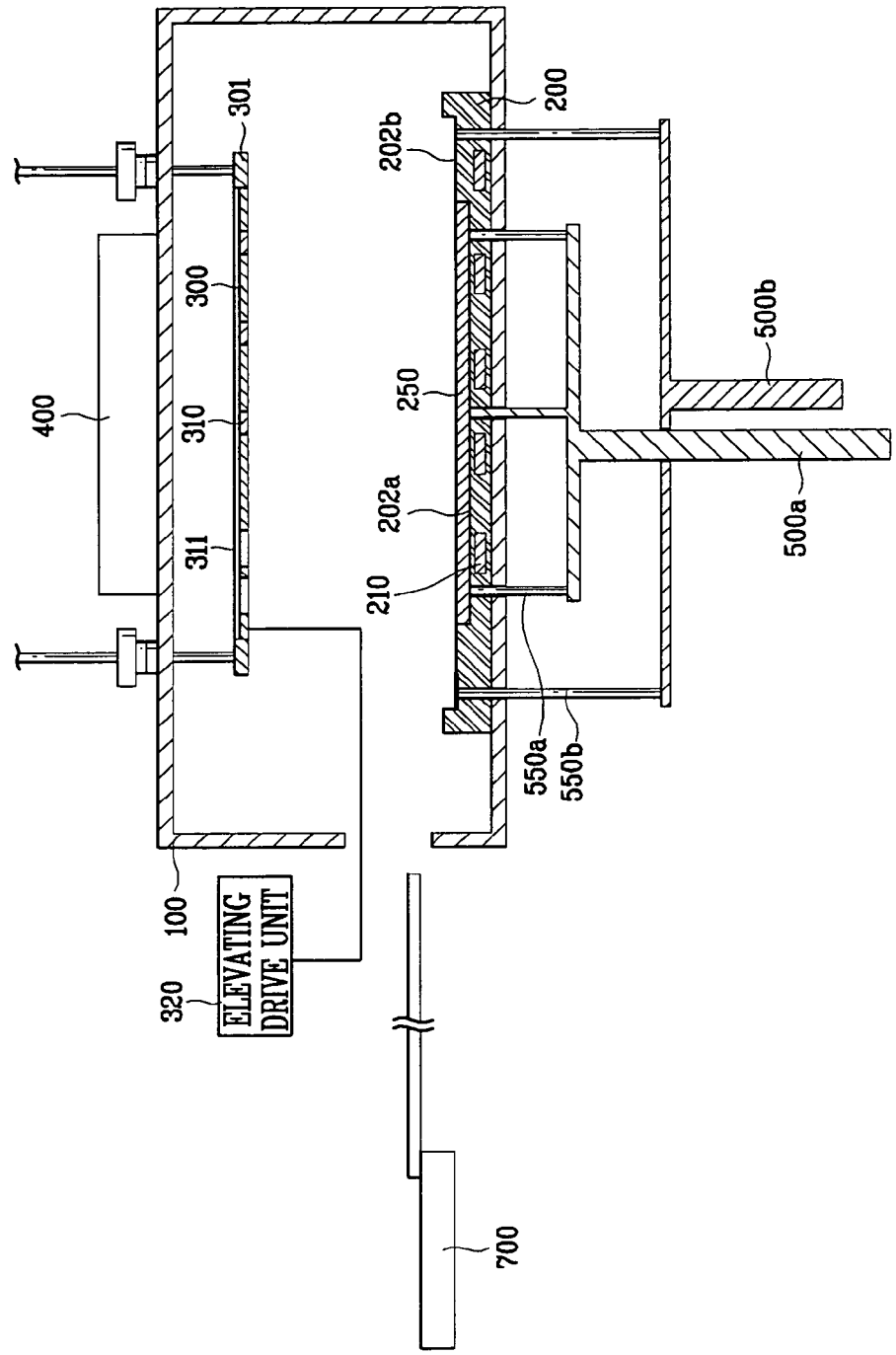

Referring to FIGS. 2A to 2E, in the laser induced thermal imaging method according to an exemplary embodiment of the present invention, the substrate 250 is first arranged on the first arrangement groove 202a of the substrate stage 200 in the chamber 100 using an end effector 700. For this, the first elevating unit 500a moves up to receive the substrate 250 from the end effector 700 using first pins 550a equipped in the first elevating unit 500a, and to support the substrate 250 (FIG. 2A). The end effector 700 is then removed out of the chamber 100 (FIG. 2B).

Figure 2C:
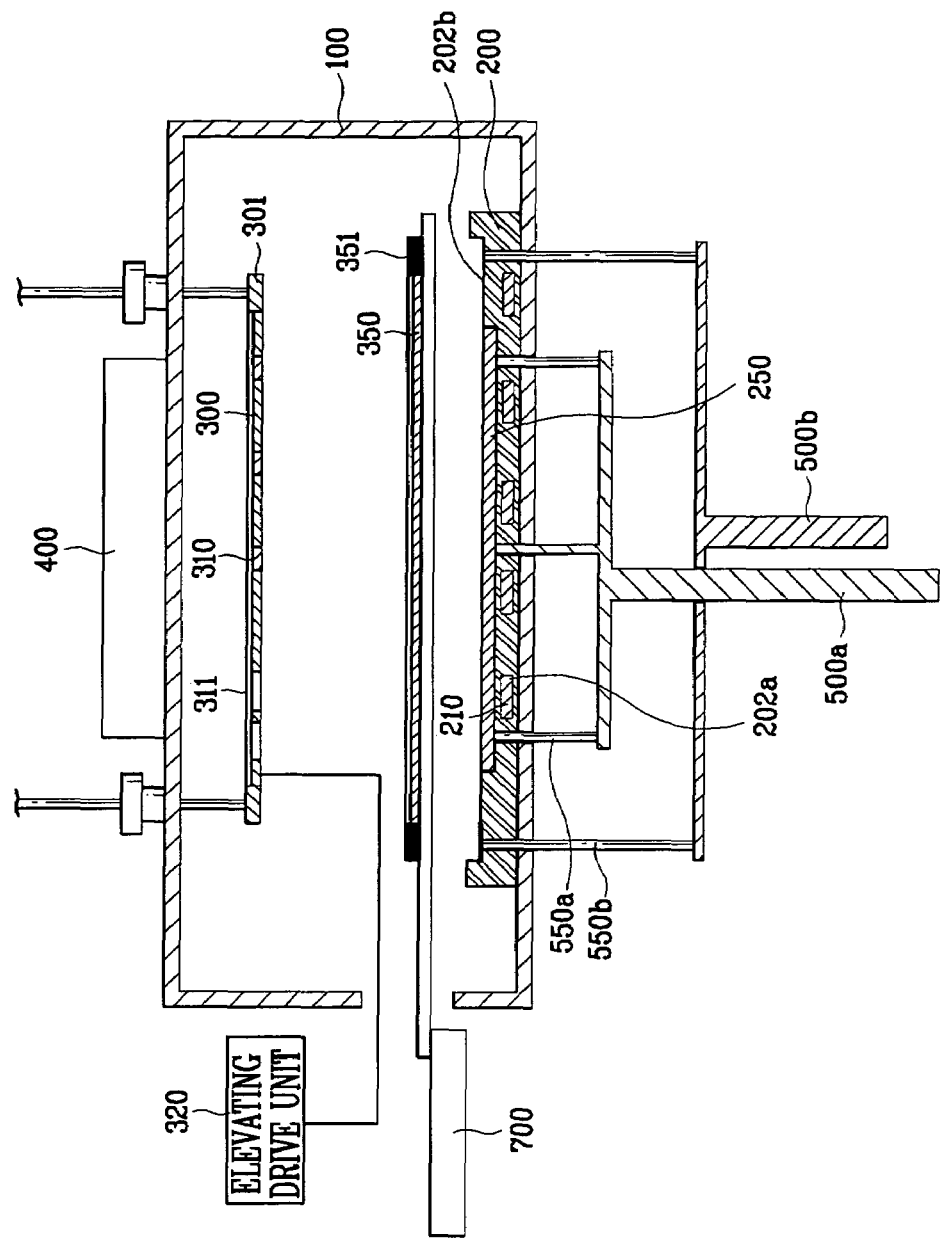
Figure 2D:
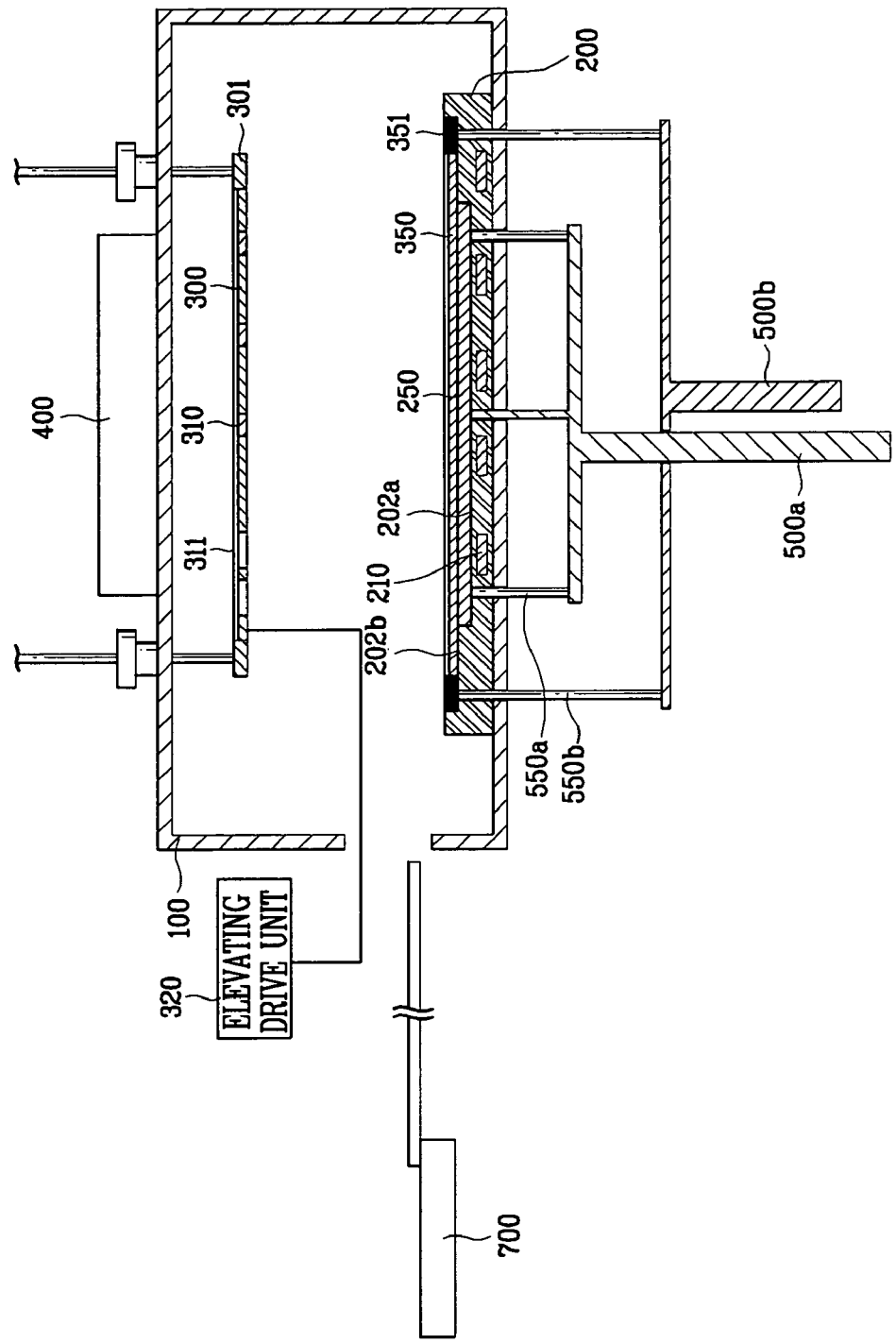

As the next process, the donor film 350 is arranged on the second arrangement groove 202b of the substrate stage 200 using the end effector 700. For this, the second elevating unit 500b moves up to receive the donor film 350 from the end effector 700 using second pins 550b equipped in the second elevating unit 500b, and to support the donor film 350 (FIG. 2C). Then, the donor film 350 is laminated onto the previously disposed substrate 250. Here, the donor film 350 is arranged on the second arrangement groove 202b while it is fixed by the film frame 351 (FIG. 2D).

Subsequently, the adhesion frame 300 is closely adhered onto the donor film 350 by controlling the adhesion strength so that a fine gap cannot be formed between the substrate 250 and the donor film 350, which are closely adhered to each other. Then, the adhesion frame 300 moves down while it is fixed by the adhesion frame tray 301. An adhesion property between the substrate 250 and the donor film 350 may be improved by controlling the adhesion strength between the adhesion frame 300 and the substrate support 200 since the electromagnet 210 is equipped in the inside of the substrate stage 200. Subsequently, the next laser transfer process is carried out on the adhesion frame 300 equipped with a predetermined pattern of openings 311 using a laser oscillator 400. At this time, the donor film 350 is transferred in a predetermined pattern onto the substrate 250 since it is a transfer source (or deposition source) for transferring organic materials to the substrate 250. Accordingly, a predetermined pattern of an organic material is transferred onto the substrate 250 by irradiating the laser onto the adhesion frame 300 since the adhesion frame 300 has a predetermined pattern of openings. That is to say, the adhesion frame 300 may function as a mask where the laser may be irradiated only through its predetermined region (FIG. 2E).

According to the aforementioned laser induced thermal imaging method in an exemplary embodiment of the present invention, the aforementioned process may be progressed by fixing the substrate stage 200 for supporting the substrate 250 and driving the adhesion frame 300 down in the method that the substrate 250 and the donor film 350 are laminated, and then closely adhered to each other using the adhesion frame 300. And, when a process shown in FIG. 2E is completed, the adhesion frame 300 moves up again and returns to an original position using the elevating drive unit.

The laser induced thermal imaging apparatus and laser induced thermal imaging method according to an exemplary embodiment of the present invention may be useful to prevent a fine gap from being generated between the donor film and the substrate. Accordingly, the laser induced thermal imaging apparatus and laser induced thermal imaging method according to an exemplary embodiment of the present invention may improve the bonding property between the substrate and the donor film, and therefore improve lifetime, yield and reliability of the device.

Although certain exemplary embodiments of the present invention have been shown and described in detail, it would be appreciated by those skilled in the art that the description proposed herein is just an example for the purpose of illustrations only, and not intended to limit the scope of the invention. And, it should also be understood that other equivalents and modifications could be made thereto without departing from the spirit and scope of the invention.

What is claimed is:

1. A laser induced thermal imaging apparatus comprising:
   a chamber configured to contain a donor film and a substrate during a process for laminating the donor film on the substrate;
   a substrate stage having a first electromagnet, the substrate stage being in the chamber and configured to support the substrate;
   an adhesion frame having a second electromagnet and being in the chamber, the adhesion frame having an opening corresponding to a portion of the donor film to be laminated on the substrate, the adhesion frame and the substrate stage being configured to receive the donor film and the substrate between the substrate stage and the adhesion frame and configured to closely adhere the donor film and the substrate to each other utilizing a magnetic force formed between the first electromagnet and the second electromagnet;
   a laser oscillator configured to apply a laser output to the donor film through the opening of the adhesion frame; and
   an elevating drive unit coupled to the adhesion frame and configured to control both upward and downward movements of the adhesion frame and an adhesion strength between the donor film and the substrate utilizing the magnetic force formed between the first electromagnet and the second electromagnet.

2. The laser induced thermal imaging apparatus according to claim 1, wherein the adhesion frame is formed into the second electromagnet.

3. The laser induced thermal imaging apparatus according to claim 1, wherein the second electromagnet is coupled to an upper or lower portion of the adhesion frame.

4. The laser induced thermal imaging apparatus according to claim 1, wherein the elevating drive unit comprises a current source for supplying an electric current to the adhesion frame.

5. The laser induced thermal imaging apparatus according to claim 1, wherein the first electromagnet is inside of the substrate stage.

6. The laser induced thermal imaging apparatus according to claim 1, wherein the laser oscillator is positioned over the adhesion frame.

7. The laser induced thermal imaging apparatus according to claim 1, wherein the laser oscillator is inside of the chamber.

8. The laser induced thermal imaging apparatus according to claim 1, wherein the laser oscillator is outside of the chamber.

9. The laser induced thermal imaging apparatus according to claim 1, wherein the first electromagnet comprises a plurality of electromagnets spaced apart from each other.

10. The laser induced thermal imaging apparatus according to claim 1, wherein the second electromagnet comprises a plurality of electromagnets spaced apart from each other.

11. The laser induced thermal imaging apparatus according to claim 4, wherein the current source of the elevating drive unit is configured to control at least one selected from the group consisting of a magnitude of the electric current and a direction of the electric current for controlling an adhesion strength between the adhesion frame and the substrate stage.

12. The laser induced thermal imaging apparatus according to claim 1, wherein the elevating drive unit comprises a current source configured to supply an electric current to the adhesion frame and control a magnitude of the electric current for controlling the adhesion strength between the donor film and the substrate.

13. The laser induced thermal imaging apparatus according to claim 1, wherein the elevating drive unit comprises a current source configured to supply an electric current to the adhesion frame and control a direction of the electric current for controlling the upward and downward movements of the adhesion frame.

14. The laser induced thermal imaging apparatus according to claim 1, further comprising an adhesion frame tray in the chamber, the adhesion frame tray coupled to and supporting the adhesion frame and drivable in upward and downward directions by the elevating drive unit.

15. The laser induced thermal imaging apparatus according to claim 9, wherein the plurality of electromagnets spaced apart from each other are arranged in a circular pattern.

* * * * *